United States Patent
Tsukagoshi

(10) Patent No.: US 11,764,131 B2
(45) Date of Patent: Sep. 19, 2023

(54) SEMICONDUCTOR DEVICE AND MANUFACTURING METHOD THEREOF

(71) Applicant: ABLIC Inc., Tokyo (JP)

(72) Inventor: Koji Tsukagoshi, Tokyo (JP)

(73) Assignee: ABLIC Inc., Nagano (JP)

( * ) Notice: Subject to any disclaimer, the term of this patent is extended or adjusted under 35 U.S.C. 154(b) by 0 days.

(21) Appl. No.: 17/562,965

(22) Filed: Dec. 27, 2021

(65) Prior Publication Data
US 2022/0238418 A1    Jul. 28, 2022

(30) Foreign Application Priority Data

Jan. 26, 2021  (JP) ................. 2021-009987

(51) Int. Cl.
| | |
|---|---|
| H01L 23/532 | (2006.01) |
| H01L 23/495 | (2006.01) |
| H01L 23/02 | (2006.01) |
| H01L 23/00 | (2006.01) |
| H01L 21/56 | (2006.01) |

(52) U.S. Cl.
CPC ......... *H01L 23/4951* (2013.01); *H01L 21/56* (2013.01); *H01L 23/02* (2013.01); *H01L 23/49582* (2013.01); *H01L 23/53242* (2013.01); *H01L 24/47* (2013.01); *H01L 2224/13144* (2013.01); *H01L 2924/01079* (2013.01)

(58) Field of Classification Search
CPC ........... H01L 23/4951; H01L 23/49582; H01L 23/53242
See application file for complete search history.

(56) References Cited

U.S. PATENT DOCUMENTS

| | | | | |
|---|---|---|---|---|
| 4,942,454 A * | 7/1990 | Mori | ................. | H01L 24/83 257/676 |
| 6,194,777 B1 * | 2/2001 | Abbott | ................ | H01L 24/48 257/769 |
| 6,593,643 B1 * | 7/2003 | Seki | .................. | H01L 23/49582 29/883 |
| 6,700,187 B2 * | 3/2004 | Paek | ................... | H01L 23/3114 257/673 |
| 7,170,168 B2 * | 1/2007 | Wu | ...................... | H01L 23/3107 257/676 |
| 7,268,415 B2 * | 9/2007 | Abbott | ............. | H01L 23/49582 438/123 |
| 7,358,119 B2 * | 4/2008 | McLellan | ............. | H01L 24/97 257/E21.503 |

(Continued)

FOREIGN PATENT DOCUMENTS

| | | |
|---|---|---|
| JP | 2015073120 | 4/2015 |
| JP | 2017195267 | 10/2017 |

*Primary Examiner* — Eugene Lee
(74) *Attorney, Agent, or Firm* — JCIPRNET

(57) ABSTRACT

The present invention provides a small and thin semiconductor device. The semiconductor device flip-chip bonds a semiconductor chip 1 and a lead 6 via a metal bonding portion 5 and includes a sealing resin covering them. The metal bonding portion 5 is provided with a gold-rich bonding layer 5a on the side of a first electrode 3a of the semiconductor chip 1 and a gold-rich bonding layer 5b on the side of a second electrode 3b of the lead 6, and connection between the semiconductor chip 1 and the lead 6 is strengthened, so that the semiconductor device does not require an anchor portion.

4 Claims, 7 Drawing Sheets

(56) References Cited

U.S. PATENT DOCUMENTS

| | | | | |
|---|---|---|---|---|
| 8,129,229 B1* | 3/2012 | Sirinorakul | ....... | H01L 23/49586 |
| | | | | 438/114 |
| 8,405,230 B2* | 3/2013 | Lee | ......... | H01L 23/16 |
| | | | | 257/667 |
| 10,665,533 B2* | 5/2020 | Sonehara | .......... | H01L 23/49548 |
| 11,094,559 B2* | 8/2021 | Wendt | .................... | H01L 24/32 |
| 2004/0232534 A1* | 11/2004 | Seki | ....................... | C25D 5/617 |
| | | | | 257/E23.092 |
| 2007/0108624 A1* | 5/2007 | Punzalan | ................ | H01L 24/16 |
| | | | | 257/E23.021 |
| 2011/0074016 A1 | 3/2011 | Narita | | |
| 2013/0280865 A1* | 10/2013 | Shen | ....................... | H01L 21/56 |
| | | | | 438/123 |
| 2014/0361444 A1 | 12/2014 | Narita | | |

* cited by examiner

SEMICONDUCTOR DEVICE AND MANUFACTURING METHOD THEREOF

CROSS-REFERENCE TO RELATED APPLICATION

This application claims the priority benefits of Japanese application no. 2021-009987, filed on Jan. 26, 2021. The entirety of the above-mentioned patent application is hereby incorporated by reference herein and made a part of this specification.

BACKGROUND

Technical Field

The present invention relates to a semiconductor device and a manufacturing method thereof.

Description of Related Art

The semiconductor device mounted on a portable device and an IC card is required to be smaller and thinner. It is well known that the mounting area of a semiconductor device can be reduced by adopting a non-lead type in which a lead end surface is flush with a package end surface.

Patent Document 1 (Japanese Patent Laid-Open No. 2015-73120) discloses a non-lead type small and thin semiconductor device.

SUMMARY

Problems to be Solved

However, in the non-lead type semiconductor device described in Patent Document 1, the peripheral edge portion on the back surface side of each lead is cut by a half-etching process to form a recessed shape, and a sealing resin is filled to cover the recessed portion, so that the exposed side surface of each lead is surrounded by a part of the side surface of the sealing body. The half-etched region of the lead prevents the lead from falling off, but this half-etched region hinders the miniaturization and thinning of the semiconductor device.

In view of the above, the present invention provides a smaller and thinner semiconductor device.

Means for Solving the Problems

The following means is used in the present invention. A semiconductor device in accordance with an embodiment of the present invention includes: a semiconductor chip including a plurality of first electrodes; a lead having a support surface and a lead bottom surface facing opposite sides, and including a second electrode on the support surface; a metal bonding portion connecting the first electrodes and the second electrode; a sealing resin sealing the semiconductor chip, the lead, and the metal bonding portion; and an external terminal formed on the lead bottom surface and a lead side surface intersecting the lead bottom surface, and exposed from the sealing resin. The metal bonding portion is an alloy containing gold, and includes a first gold-rich bonding layer having a higher gold content than the alloy on a first electrode side, and a second gold-rich bonding layer having a higher gold content than the alloy on a second electrode side.

A manufacturing method in accordance with an embodiment of the present invention is provided for manufacturing a semiconductor device in which a semiconductor chip is flip-chip bonded to a lead. The manufacturing method includes: forming a first bonding base film on a main surface of the semiconductor chip; forming a second bonding base film on a support surface of the lead; coating a connecting material in a molten state on the first bonding base film and solidifying the connecting material; superposing the main surface of the semiconductor chip on the support surface of the lead to face the support surface of the lead; heating the lead to connect the semiconductor chip and the lead via a metal bonding portion; resin-sealing the semiconductor chip, the lead, and the metal bonding portion; and providing an external terminal on the lead.

A manufacturing method in accordance with an embodiment of the present invention is provided for manufacturing a semiconductor device in which a semiconductor chip is flip-chip bonded to a lead. The manufacturing method includes: forming a first bonding base film on a main surface of the semiconductor chip; forming a thick region and a thin region on the lead; forming a second bonding base film on a support surface of the thin region of the lead; coating a connecting material in a molten state on the first bonding base film and solidifying the connecting material; superposing the main surface of the semiconductor chip on a second electrode of the support surface of the lead to face the second electrode of the support surface of the lead; heating the lead to connect the semiconductor chip and the lead via a metal bonding portion; resin-sealing the semiconductor chip, the lead, and the metal bonding portion; and providing an external terminal on the lead.

Effects

By using the above means, it is possible to obtain a small and thin semiconductor device while preventing the lead from falling off from the sealing resin.

DESCRIPTION OF THE EMBODIMENTS

Hereinafter, the semiconductor devices according to the embodiments of the present invention will be described with reference to the drawings.

First Embodiment

Figure 1:
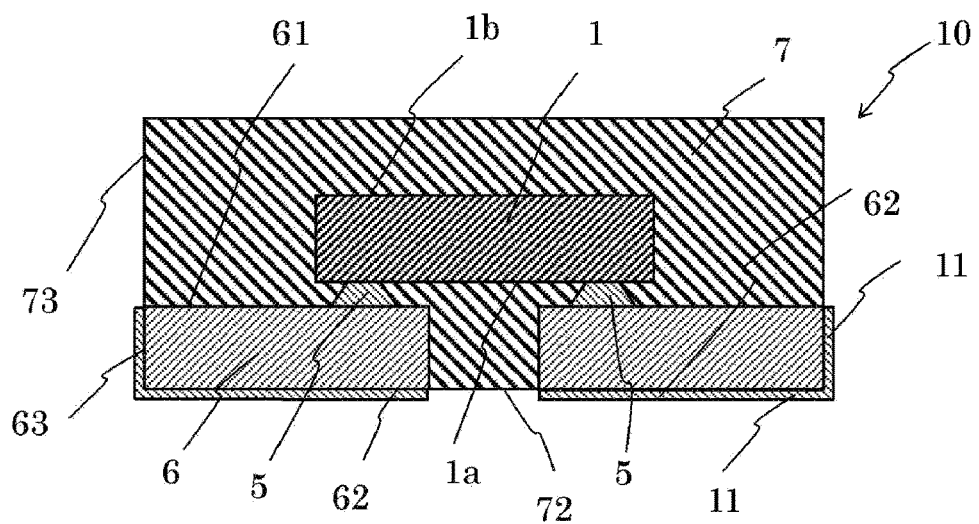
FIG. 1 is a cross-sectional view of the semiconductor device according to the first embodiment of the present invention.

FIG. 1 is a cross-sectional view of the semiconductor device according to the first embodiment of the present invention. The semiconductor device 10 is a flip-chip type non-lead structure package which has a configuration including a semiconductor chip 1, leads 6, metal bonding portions 5, and a sealing resin 7. Since the semiconductor device 10 is a flip-chip type, the semiconductor device 10 has a structure which does not require a bonding wire or a die pad. The lead 6 is composed of copper (Cu) or a copper alloy having a uniform thickness, and has a support surface 61 on the front surface and a lead bottom surface 62 on a back surface 1b opposite to the front surface. Then, the semiconductor chip 1 is connected to the support surface 61. An electrode (not illustrated) provided on a main surface 1a of the semiconductor chip 1 and an electrode (not illustrated) provided on the support surface 61 of the lead 6 are electrically connected via the metal bonding portion 5 which contains gold (Au), and the semiconductor chip 1 is inverted and connected so that the main surface 1a faces downward.

The periphery of the semiconductor chip 1, the leads 6, and the metal bonding portions 5 is covered with the sealing resin 7, but the lead bottom surface 62 and a lead side surface 63 are exposed from the sealing resin 7. The semiconductor device 10 is rectangular in the cross section, and the lead bottom surface 62 is flush with a resin bottom surface 72 of the sealing resin 7 and the lead side surface 63 is flush with a resin side surface 73 of the sealing resin 7. Then, an external terminal 11 for mounting on a board is attached to the lead bottom surface 62 and the lead side surface 63. The external terminal 11 is a laminated film in which a nickel (Ni) film and a gold (Au) film are sequentially attached from the side of the lead bottom surface 62 and the side of the lead side surface 63. Alternatively, the external terminal 11 is a laminated film in which a nickel (Ni) film, a palladium (Pd) film, and a gold (Au) film are sequentially attached.

Figure 2:
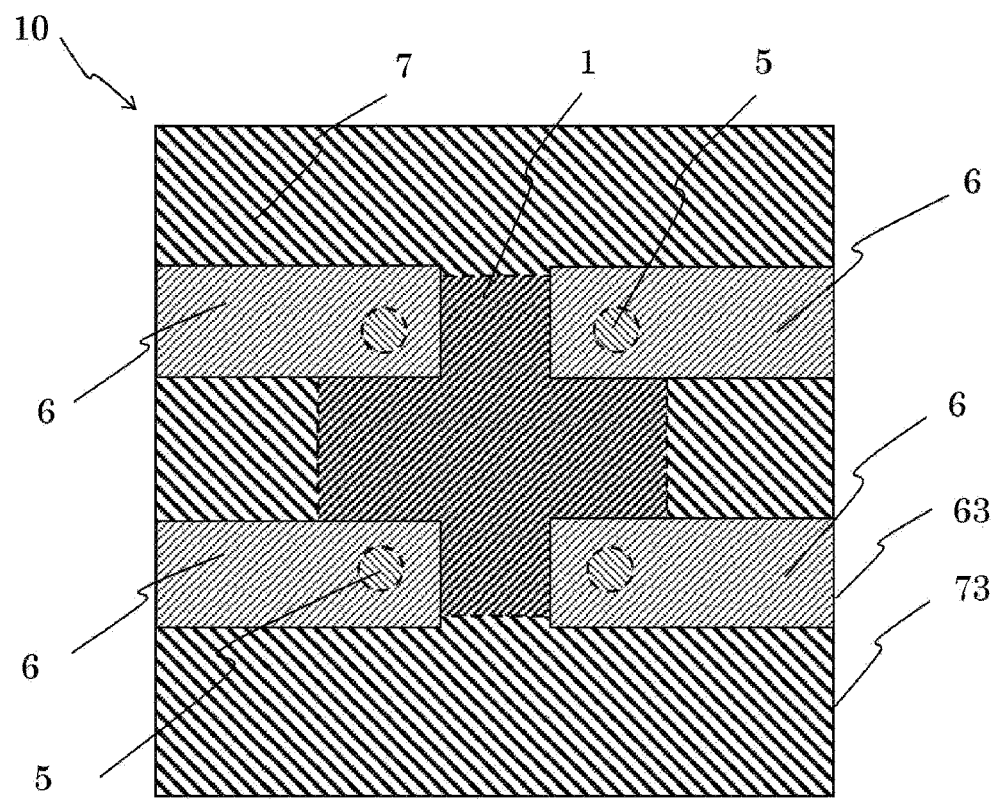
FIG. 2 is a bottom view of the semiconductor device according to the first embodiment of the present invention.

FIG. 2 is a bottom view of the semiconductor device according to the first embodiment of the present invention. In FIG. 2, for convenience of understanding, the sealing resin 7 can be seen through. The semiconductor device 10 is a non-lead structure package including four leads 6, one end of each lead 6 is arranged to be separated from each other, and the end surface of the other end of the lead 6 forms the same surface as the outer periphery of the sealing resin 7. The semiconductor chip 1 (illustrated by broken lines) is arranged in the center of the rectangular sealing resin 7, and the four corners of the semiconductor chip 1 respectively overlap the leads 6. Electrodes are arranged at the four corners of the semiconductor chip 1, and the metal bonding portions 5 (illustrated by broken lines) are provided on the electrodes, and the semiconductor chip 1 and the leads 6 are connected via the metal bonding portions 5. Then, the plane regions of the metal bonding portions 5 arranged at the four corners of the semiconductor chip 1 have a shape included in the plane regions of the leads 6.

Figure 3:
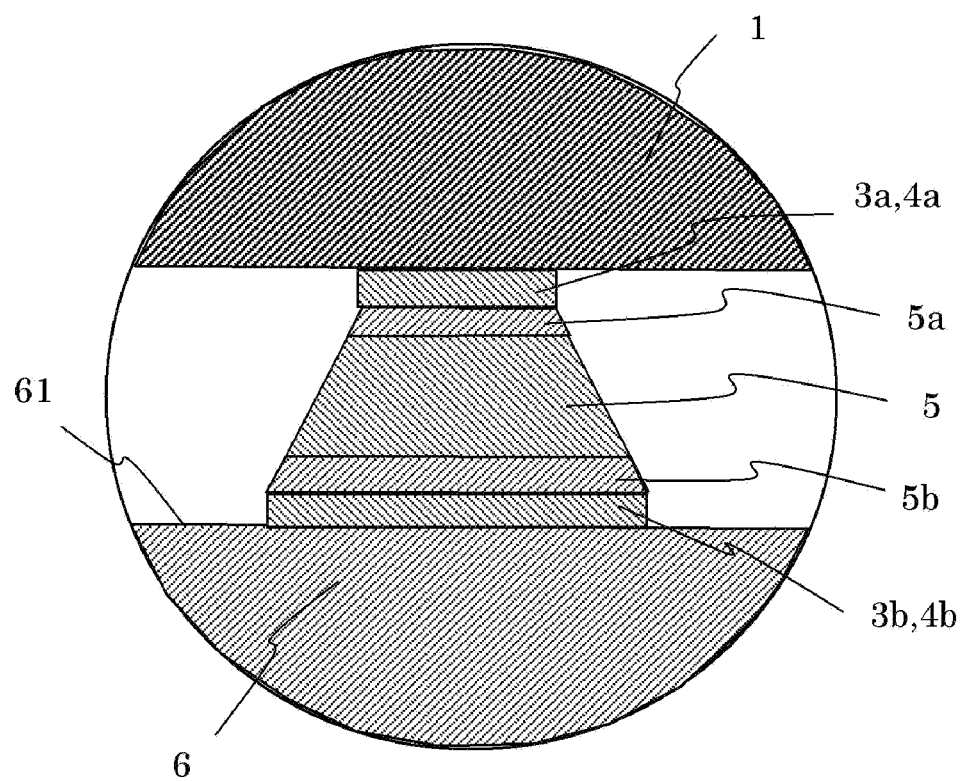
FIG. 3 is an enlarged cross-sectional view of the bonding portion of the semiconductor device according to the first embodiment of the present invention.

FIG. 3 is an enlarged cross-sectional view of the bonding portion between the semiconductor chip and the lead. The metal bonding portion 5 is an alloy containing gold (Au) and is composed of, for example, a gold-tin (AuSn) alloy, and is connected to an electrode 3a on the side of the semiconductor chip 1 via a gold-rich bonding layer 5a on the side of the semiconductor chip 1. Further, the metal bonding portion 5 is also connected to an electrode 3b on the side of the lead 6 via a gold-rich bonding layer 5b on the side of the lead 6. The electrodes 3a and 3b are composed of nickel (Ni) films 4a and 4b which are barrier films. The Au/Sn component ratio of the gold-rich bonding layers 5a and 5b is higher than the Au/Sn component ratio of the metal bonding portion 5, that is, they have a high gold (Au) content. Further, the components in the gold-rich bonding layers 5a and 5b are not uniform, and the ratio is higher as it gets closer to the nickel film 4a in distance. The flat area of the metal bonding portion 5 and the gold-rich bonding layer 5b on the side of the lead 6 is larger than the flat area of the metal bonding portion 5 and the gold-rich bonding layer 5a on the side of the semiconductor chip 1. In this figure, the nickel film 4b is provided in a limited partial region of the support surface 61 of the lead 6, but the nickel film 4b, which is a barrier film, may be attached to the entire region of the support surface. The gold-rich bonding layers 5a and 5b located between the metal bonding portion 5 and the nickel film 4a are formed by diffusing the constituent components of the metal bonding portion 5, and the formed bonding region is strong. Further, the distance between the semiconductor chip 1 and the lead 6 in the thickness direction is 3 µm to 5 µm and is extremely small. As described above, since the semiconductor chip 1 and the leads 6 are firmly connected to each other, they are not easily peeled off. Therefore, although the periphery of the semiconductor chip 1 is completely covered by the sealing resin 7, there is no concern that the pull-out strength of the lead 6 may decrease and the lead 6 may fall off from the sealing resin 7, and anchor processing such as forming a thin portion for preventing the lead 6 from falling off from the sealing resin 7 is not required. Therefore, the lead 6 does not need to have the thickness and width required for anchor processing, and the plate thickness and area of the lead 6 can be reduced. As a result, the semiconductor device can be made thinner (lowered in height) and smaller. Moreover, the additional processing of anchor processing is not required, and the man-hours in manufacturing can be reduced.

Figure 4A:
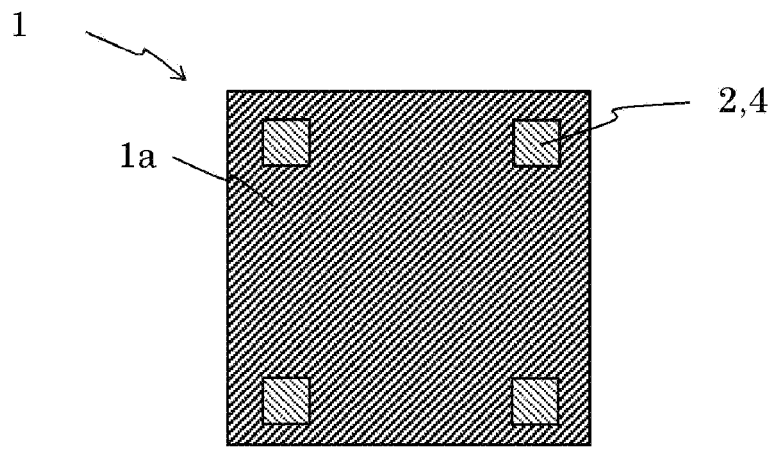
FIG. 4A is a schematic view illustrating the method of manufacturing the semiconductor device according to the first embodiment of the present invention.
Figure 4B:
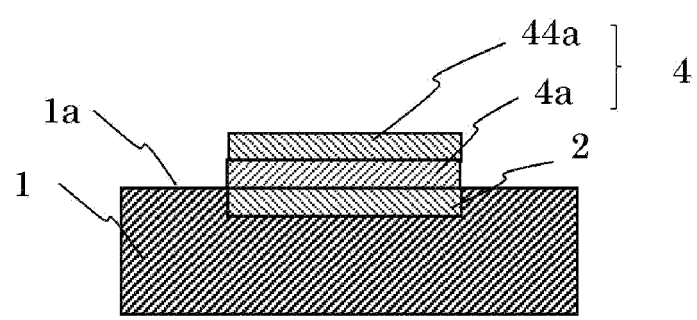
FIG. 4B is a schematic view illustrating the method of manufacturing the semiconductor device according to the first embodiment of the present invention.

A method of manufacturing the semiconductor device according to the first embodiment of the present invention will be described with reference to FIG. 4A to FIG. 7. First, the semiconductor chip 1 illustrated in FIG. 4A and FIG. 4B is prepared. FIG. 4A and FIG. 4B are a top view of the semiconductor chip 1 and an enlarged cross-sectional view of the pad portion before connection to the lead 6. As illustrated in FIG. 4A, in this example, four bonding base films 4 are provided to cover the pads 2 respectively at the four corners of the main surface 1a of the rectangular semiconductor chip 1. FIG. 4B illustrates the cross-sectional structure of the pad portion, and an aluminum (Al) film is formed as the pad 2 on the main surface 1a of the semiconductor chip 1. The aluminum film which is the pad 2 is the same layer as the top layer wiring of the semiconductor chip 1. A nickel (Ni) film 4a and a gold (Au) film 44a are sequentially laminated on the pad 2 as the bonding base film 4. The nickel film 4a serves as a barrier film, and the gold film 44a has a role of improving wettability. Although the aluminum film is prone to oxidation and corrosion in the air, by forming the nickel film 4a and the gold film 44a on the surface, the surface is in a state where oxidation and corrosion are unlikely to occur. The nickel film 4a and the gold film 44a are preferably formed by a wet plating method (nickel plating and gold flash plating). In the case of a three-layer laminated film containing a palladium (Pd) film, the formation of the bonding base film 4 on the pad 2 is completed by sequentially performing nickel plating, palladium plating, and gold flash plating.

Figure 5A:
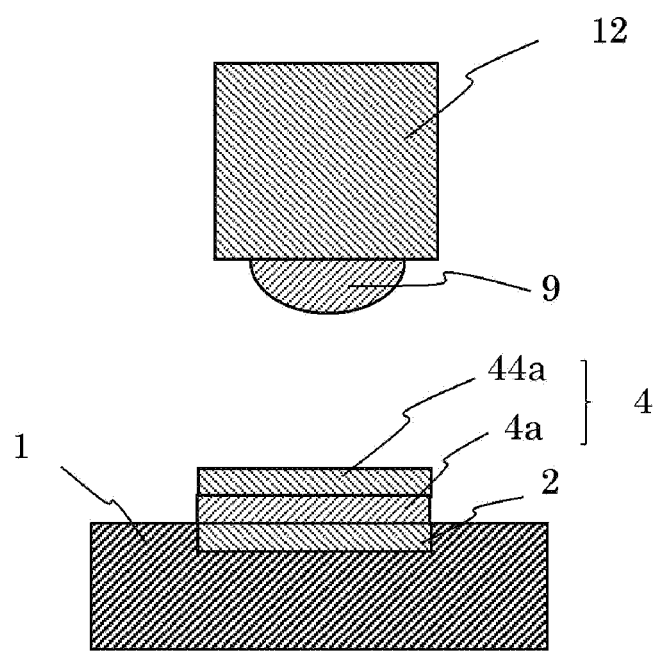
FIG. 5A is a schematic view illustrating the method of manufacturing the semiconductor device according to the first embodiment of the present invention, following FIG. 4A and FIG. 4B.
Figure 5B:
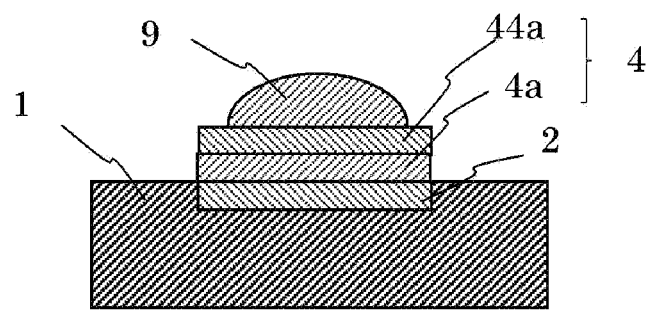
FIG. 5B is a schematic view illustrating the method of manufacturing the semiconductor device according to the first embodiment of the present invention, following FIG. 4A and FIG. 4B.
Figure 5C:
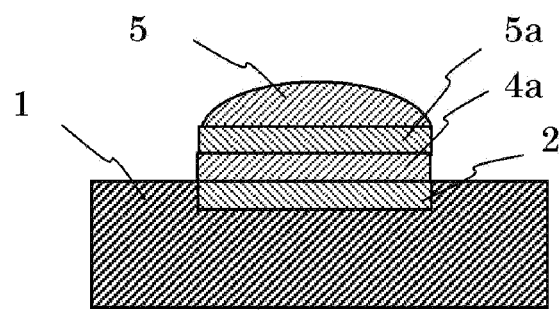
FIG. 5C is a schematic view illustrating the method of manufacturing the semiconductor device according to the first embodiment of the present invention, following FIG. 4A and FIG. 4B.

Next, a connecting material 9 which is an alloy composed of two or more metals including gold (Au) is dispensed (drop-coated) in a molten state on the pad 2 of the semiconductor chip 1. FIG. 5A, FIG. 5B, and FIG. 5C are views illustrating states before and after dispensing the connecting material 9 on the pad 2. FIG. 5A illustrates the semiconductor chip 1 and a heating pod 12. The heating pod 12 includes a heating means, a degassing means, and a dispensing means, and the connecting material 9 in a molten state is stored in the heating pod 12. The connecting material 9 is a gold-tin alloy, and has a component ratio of, for example, Au/Sn=80/20 or Au/Sn=78/22. The heating pod 12 is controlled to be at 300° C. to 320° C. by the heating means, and minute bubbles in the connecting material 9 in the molten state are removed by the degassing means. In addition, organic substances or the like are sufficiently demineralized. The dispensing means is provided at the lower end of the heating pod 12, and the surrounding thereof is purged with nitrogen, and the ambient temperature is room temperature. The semiconductor chip 1 is also kept at room temperature without being heated.

As illustrated in FIG. 5B, when the molten connecting material 9 is dispensed on the bonding base film 4 on the pad 2 of the semiconductor chip 1, since the connecting material 9 in the molten state has a constant surface tension, it has a shape with a constant curvature on the bonding base film 4. Further, the size of the connecting material 9 dispensed at this time is smaller than the size of the pad 2 of the semiconductor chip 1.

When the connecting material 9 is dispensed on the semiconductor chip 1, it is desirable that the semiconductor chip 1 is diced from a semiconductor wafer and separated into individual pieces. Although it is more efficient to dispense the connecting material 9 on the semiconductor chip 1 before dicing, dicing after dispensing exposes the semiconductor chip 1 to the cut dust and moisture generated at that time. In order to avoid this, the method of dispensing the connecting material 9 after dicing is preferable.

FIG. 5C illustrates a state in which the connecting material 9 is dispensed on the bonding base film 4 on the pad 2 of the semiconductor chip 1 and then solidified by the pad 2. The connecting material 9 in the molten state dispensed at 310° C. to 320° C. is melted with the bonding base film 4 on the pad 2 and then cooled to room temperature to form the following structure. That is, the nickel film 4a is laminated on the pad 2, and the gold-rich bonding layer 5a is formed on the nickel film 4a. The gold-rich bonding layer 5a is obtained by diffusing the metal bonding portion 5 into the gold film 44a, and the Au/Sn component ratio of the gold-rich bonding layer 5a is higher than the Au/Sn component ratio of the metal bonding portion 5, that is, it has a high gold (Au) content. Further, the components in the gold-rich bonding layer 5a are not uniform, and the ratio is higher as it gets closer to the nickel film 4a in distance.

By dispensing molten gold tin, which is the connecting material 9, on the bonding base film 4 on each pad 2 as described above for all the pads 2 on the semiconductor chip 1, the connection between the metal bonding portion 5 and the semiconductor chip 1 is completed. The connection between the semiconductor chip 1 and the metal bonding portion 5 obtained by such a method can be performed by processes which require fewer man-hours than the conventional connection method. For example, the conventional method of forming bumps goes through many processes such as a pattern formation process with resist for bump formation, a plating process, a resist removal process, and then a reflow process, but in this manufacturing method, the connection is completed by an extremely small number of processes of simply dispensing the pre-melted connecting material 9 on the bonding base film 4 on the pad 2. Furthermore, since the temperature is higher than the connection temperature for the conventional semiconductor device illustrated in Patent Document 1, the connection between the semiconductor chip 1 and the metal bonding portion 5 obtained by this manufacturing method is a strong connection with few voids.

Figure 6A:
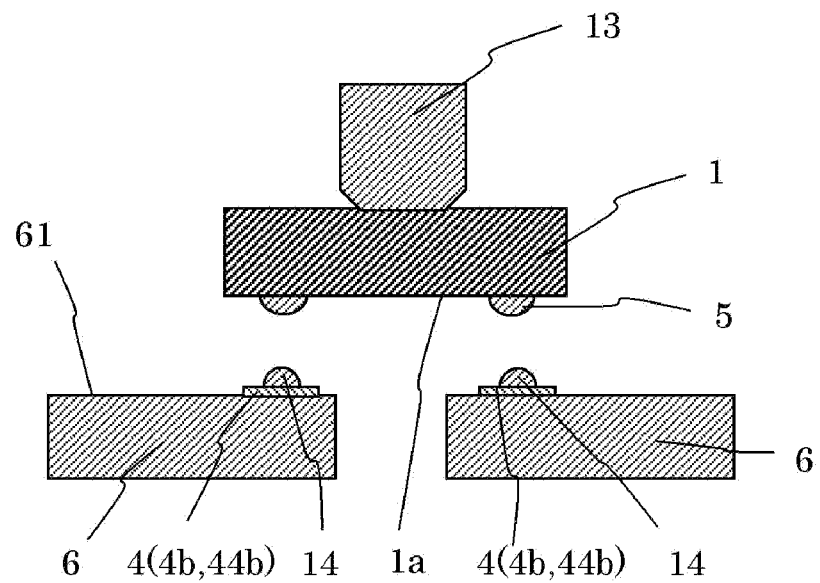
FIG. 6A is a schematic view illustrating the method of manufacturing the semiconductor device according to the first embodiment of the present invention, following FIG. 5A, FIG. 5B, and FIG. 5C.
Figure 6B:
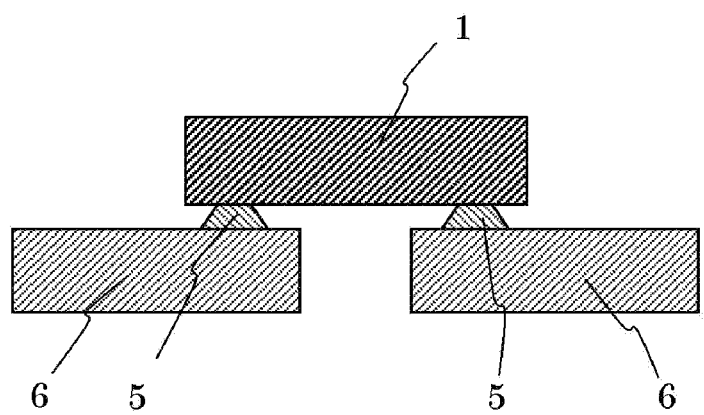
FIG. 6B is a schematic view illustrating the method of manufacturing the semiconductor device according to the first embodiment of the present invention, following FIG. 5A, FIG. 5B, and FIG. 5C.

Next, as illustrated in FIG. 6A and FIG. 6B, the semiconductor chip 1 provided with the metal bonding portions 5 is connected to the leads 6. FIG. 6A illustrates the state before connection, and the semiconductor chip 1 stands by above the leads 6. The side of the back surface 1b of the semiconductor chip 1 is picked up using a collet 13, and the main surface 1a of the semiconductor chip 1 on which the metal bonding portions 5 are formed is inverted downward and faces the support surfaces 61 of the leads 6. The nickel (Ni) film 4b and the gold (Au) film 44b are sequentially laminated as the bonding base film 4 at a predetermined position on the support surface 61 of the opposing lead 6. Alternatively, a nickel (Ni) film, a palladium (Pd) film, and a gold (Au) film are sequentially laminated. The bonding base film 4 is formed by a wet plating method. Then, the flat area of the bonding base film 4 on the side of the lead 6 is formed larger than the flat area of the bonding base film 4 formed on the side of the semiconductor chip 1.

An organic solvent 14 is coated in dots on the surface of the bonding base film 4 of the opposing lead 6. The portion to which the organic solvent 14 is coated corresponds to the position where the semiconductor chip 1 is to be connected, and serves for self-alignment and temporary fixing when connecting the semiconductor chip 1 to the lead 6. At this time, both the semiconductor chip 1 and the lead 6 are placed in a room temperature atmosphere.

Next, the collet 13 is lowered together with the semiconductor chip 1, and the metal bonding portion 5 of the semiconductor chip 1 is superposed to abut the portion to which the organic solvent 14 is coated in dots. At this time, even if the superposition of the semiconductor chip 1 and the lead 6 is slightly deviated, the semiconductor chip 1 is finely moved by utilizing the self-alignment effect of the organic solvent 14, and is corrected and arranged at the appropriate position. As the organic solvent 14 for temporary fixing, it is preferable to use a solvent which evaporates when heated with a liquid at room temperature, and alcohols such as isopropyl alcohol (IPA) and ketones such as methyl ethyl ketone (MEK) are preferable. Although the above describes an example using the organic solvent 14, the process of temporarily fixing with the organic solvent 14 is not necessarily required, but by using this process, highly accurate superposition can be realized, and a smaller semiconductor device 10 can be obtained.

Thereafter, the leads 6 carrying the semiconductor chip 1 are moved to a heating stage having a nitrogen atmosphere, and are heated from the back surface side of the leads 6. The heating temperature in this process is preferably lower than the temperature at the time of connecting the semiconductor chip 1 and the metal bonding portion 5, preferably 295° C. to 305° C.

As illustrated in FIG. 6B, the organic solvent 14 evaporates due to heating, and the metal bonding portion 5 melts and connects to the bonding base film 4. The metal bonding portion 5 melts into the gold film 44b constituting the bonding base film 4 to form the gold-rich bonding layer 5b, and firmly connects the semiconductor chip 1 and the lead 6 (see FIG. 3). The surface of the metal bonding portion 5 before connection is covered with an extremely thin oxide film, but according to this method, the connection is formed at a higher temperature than the conventional bump method, so very good wet spread can be obtained without flux or the like for the purpose of removing and activating the oxide film.

Next, the semiconductor chip 1, the leads 6, and the metal bonding portions 5 are coated with the sealing resin 7, and then the leads 6 are formed if necessary. The external terminals 11 are formed on the surfaces of the lead bottom surface 62 and the lead side surface 63. When the external terminal 11 is a laminated film of a nickel (Ni) film and a gold (Au) film, the external terminal 11 can be formed by sequentially performing nickel plating and gold flash plating. In the case of a three-layer laminated film containing a palladium (Pd) film, the external terminal 11 can be formed by sequentially performing nickel plating, palladium plating, and gold flash plating. Through the above processes, the semiconductor device 10 as illustrated in FIG. 1 is completed.

In the conventional semiconductor device illustrated in Patent Document 1, the temperature at which the gold bump is bonded to the lead is about 250° C., and the bonding layer formed between the gold bump and the lead has a thin island shape. Reflow is performed when such a conventional semiconductor device is mounted on a printed circuit board, and the heat treatment temperature at that time is 255° C. to 265° C., which is higher than the temperature of connection between the gold bump and the lead. Therefore, there is a possibility that the lead may fall off from the gold bump due to the mounting on the printed circuit board, and in order to prevent this, a half-etched region (anchor portion) is provided on the peripheral edge portion on the back surface side of the lead. In contrast thereto, the heat treatment temperature (295° C. or higher) of the metal bonding portion 5 of the semiconductor device 10 obtained through the above processes is higher than the printed circuit board mounting temperature of 255° C. to 265° C., and there is no concern that the mounting on the printed circuit board may melt the metal bonding portion 5 to weaken the connection between the semiconductor chip 1 and the lead 6 and cause the lead 6 to fall off from the sealing resin 7. In other words, the lead can be prevented from falling off without providing the half-etched region required in the conventional semiconductor device. By eliminating the need for providing the half-etched region on the peripheral edge portion of the lead, the lead can be made smaller, which contributes to the miniaturization of the semiconductor device. Furthermore, the half-etched region needs a predetermined thickness from the viewpoint of ensuring the strength, but since it is not required, the thickness of the lead can be reduced. The reduction in the thickness of the lead contributes to the thinning of the semiconductor device. As described above, the semiconductor device of the present invention, which does not require the half-etched region, can be made smaller and thinner.

An example in which a gold-tin alloy is used as the metal bonding portion 5 and the connecting material 9 has been described so far, but the same effect can be achieved even when a gold-germanium alloy is used instead of the gold-tin alloy.

Second Embodiment

Figure 7:
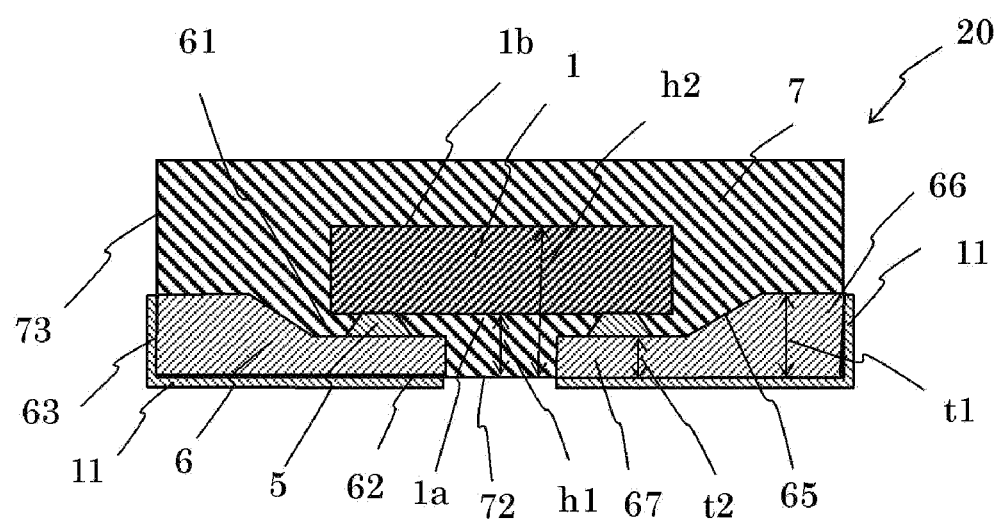
FIG. 7 is a cross-sectional view of the semiconductor device according to the second embodiment of the present invention.

FIG. 7 is a cross-sectional view of the semiconductor device according to the second embodiment of the present invention. In the semiconductor device of the first embodiment illustrated in FIG. 1, the thickness of the lead 6 is uniform, but in the semiconductor device 20 of the present embodiment, a lead thickness t1 of the lead side surface 63 and a lead thickness t2 of the support surface 61 where the semiconductor chip is bonded to the lead 6 are set to be different, and the lead thickness t2 of the support surface 61 is smaller than the lead thickness t1 of the lead side surface 63. That is, the lead 6 has a structure in which the side of the lead side surface 63, that is, the peripheral edge side of the lead 6, is a thick region 66, and the portion bonded to the semiconductor chip 1 is a thin region 67. The back surfaces of the thick region 66 and the thin region 67 form the same surface together with the resin bottom surface 72, and a step portion 65 is arranged between the upper surfaces of the thick region 66 and the thin region 67, and the step portion 65 is a forward-tapered inclined surface. Then, the semiconductor chip 1 is arranged on the inner side of the step portion 65, that is, on the thin region 67 of the lead 6. Further, the value of a height h1 of the main surface 1a of the semiconductor chip 1 from the resin bottom surface 72 at this time is smaller than the value of the lead thickness t1 and larger than the value of the lead thickness t2. The thin region 67 in this example can form the support surface 61 by partially pressing or half-etching a lead having a uniform thickness as in the semiconductor device of the first embodiment from above. Here, the portion where the lead is relatively thick, such as the portion not subjected to the pressing, corresponds to the thick region 66.

As described above, the lead 6 has a shape including the thick region 66 and the thin region 67, and the semiconductor chip 1 is mounted on the thin region 67 via the metal bonding portion 5, by which it is possible to reduce the thickness (reduce the height) of the semiconductor device 10 without impairing the mountability of the semiconductor device 10 on the printed circuit board. Normally, the connection region when mounted on the printed circuit board corresponds to the external terminal 11 of the semiconductor device 10, but when the semiconductor device 10 is made thinner, the thickness of the lead is reduced accordingly, and the area of the external terminal 11 attached to the lead side surface 63 becomes smaller. Correspondingly, the connection strength of the semiconductor device 10 to the printed circuit board becomes smaller. In contrast thereto, in the semiconductor device 20 of the present embodiment, the lead 6 is provided with the thick region 66 and the lead side surface 63 is formed there. Therefore, the area of the external terminal 11 attached to the lead side surface 63 is not reduced and the connection strength to the printed circuit board is not reduced. Furthermore, since the structure mounts the semiconductor chip 1 in the thin region 67 of the lead 6, the semiconductor device 10 can be made thinner. Further, since the semiconductor chip 1 and the lead 6 are firmly connected, the lead 6 can be prevented from falling off from the sealing resin 7.

In addition, in the manufacturing of the semiconductor device 10, the organic solvent 14 described with reference to FIG. 6A and FIG. 6B is used for temporary fixing when bonding the semiconductor chip 1 to the lead 6. Even if the metal bonding portion 5 of the semiconductor chip 1 is placed outside the coating range of the organic solvent 14, the semiconductor chip 1 is guided by the step portion 65 provided on the lead 6 to correct the position in the thin region 67, and further, the position is finely adjusted by self-alignment of the organic solvent 14. As described above, since it also has the effect of guiding the semiconductor chip 1 to an appropriate position on the lead 6, it can contribute to further miniaturization of the semiconductor device.

FIG. 7 illustrates a case where the height h2 from the resin bottom surface 72 of the back surface 1b, which is opposite to the main surface 1a of the semiconductor chip 1, is larger than the value of the lead thickness t1, that is, larger than the height of the upper surface of the thick region 66 of the lead 6 from the resin bottom surface 72, but it is clear that the semiconductor device 10 can be made even thinner by further reducing the thickness of the semiconductor chip 1, for example, by making the height h2 of the back surface 1b of the semiconductor chip 1 from the resin bottom surface 72 smaller than the height of the upper surface of the thick region 66 of the lead 6 from the resin bottom surface 72.

INDUSTRIAL APPLICABILITY

The semiconductor device according to the present invention can be applied to portable toys, health care products, wearable terminals, mobile terminals, card terminals, home appliances, etc., as well as in-vehicle applications and outdoor applications in harsh usage environments.

What is claimed is:

1. A semiconductor device, comprising:
   a semiconductor chip comprising a plurality of first electrodes;
   a lead having a support surface, a lead bottom surface, and a lead side surface, and comprising a second electrode on the support surface;
   a metal bonding portion connecting the first electrodes and the second electrode;
   a sealing resin sealing the semiconductor chip, the lead, and the metal bonding portion; and
   an external terminal formed on the lead bottom surface and the lead side surface and exposed from the sealing resin,
   wherein the metal bonding portion comprises an alloy containing gold, a first gold-rich bonding layer on a first electrode side of the metal bonding portion and having a higher gold content than the alloy, and a second gold-rich bonding layer on a second electrode side of the metal bonding portion and having a higher gold content than the alloy, and a content ratio of gold in the first gold-rich bonding layer at a side facing the semiconductor chip is higher than a content ratio of gold in the first gold-rich bonding layer at an opposing side facing away the semiconductor chip.

2. The semiconductor device according to claim 1, wherein the lead comprises a thick region provided on a lead side surface side and a thin region extending inward from the thick region, and the semiconductor chip is mounted on the thin region.

3. The semiconductor device according to claim 1, wherein a bonding area of the metal bonding portion on the second electrode side is larger than a bonding area of the metal bonding portion on the first electrode side.

4. The semiconductor device according to claim 3, wherein the lead comprises a thick region provided on a lead side surface side and a thin region extending inward from the thick region, and the semiconductor chip is mounted on the thin region.

* * * * *